United States Patent
Tong

(10) Patent No.: US 8,735,305 B2
(45) Date of Patent: May 27, 2014

(54) METHODS OF FORMING FLUORINATED HAFNIUM OXIDE GATE DIELECTRICS BY ATOMIC LAYER DEPOSITION

(75) Inventor: Jinhong Tong, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/480,331

(22) Filed: May 24, 2012

(65) Prior Publication Data

US 2013/0313657 A1   Nov. 28, 2013

(51) Int. Cl.
*H01L 21/31* (2006.01)
(52) U.S. Cl.
USPC ..... 438/785; 438/778; 438/783; 257/E23.077
(58) Field of Classification Search
USPC ........................... 438/99, 731, 778, 785, 783; 257/E23.077
See application file for complete search history.

(56) References Cited

U.S. PATENT DOCUMENTS

| | | | |
|---|---|---|---|
| 3,634,477 A * | 1/1972 | Chatteraj et al. | 556/40 |
| 7,902,018 B2 | 3/2011 | Kraus | |
| 2002/0064970 A1 * | 5/2002 | Chooi et al. | 438/785 |
| 2006/0062910 A1 * | 3/2006 | Meiere | 427/226 |
| 2008/0076268 A1 | 3/2008 | Kraus et al. | |

OTHER PUBLICATIONS

Putkonen, M., et al.; Atomic Layer Deposition of Metal Flurides through Oxide Chemistry; Jan. 1, 2011; The Royal Society of Chemistry; J. Mater. Chem pp. 1446114465.
Lee, J.C., et al.; Study on Electrical Characteristics and Reliability of Fluorinated HfO2 for HKMG; Jan. 1, 2011; Z-Book—Elsevier; Microelectronic Engineering pp. 14171420.
Yokoyama, Y., et al.; Atomic Layer Depsoition of HfP2 for Gate Dielectrics; ; Research Center for Nanodevices and Systems, Hiroshima University; 2 pages.

* cited by examiner

*Primary Examiner* — Colleen Matthews
*Assistant Examiner* — Colleen E Snow

(57) ABSTRACT

In some embodiments, the present invention discloses a gate dielectric deposition process, including depositing a fluorinated hafnium oxide by an ALD process utilizing a fluorinated hafnium precursor and an oxidant. A two-step ALD deposition process can be used, including a fluorinated hafnium oxide layer deposition followed by a hafnium oxide layer deposition. Hafnium oxide can provide high dielectric constant, high density, large bandgap and good thermal stability. Fluorinated hafnium oxide can passivate interface states and bulk traps in the hafnium oxide, for example, by forming Si—F or Hf—F bonds, which can improve the reliability of the hafnium oxide gate dielectrics.

16 Claims, 7 Drawing Sheets

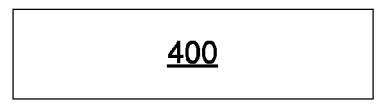
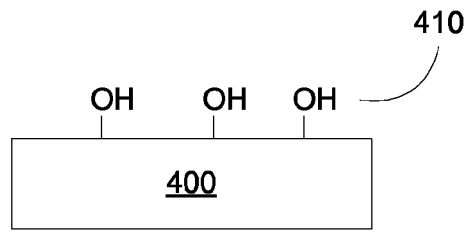
Fig. 4A    Fig. 4B
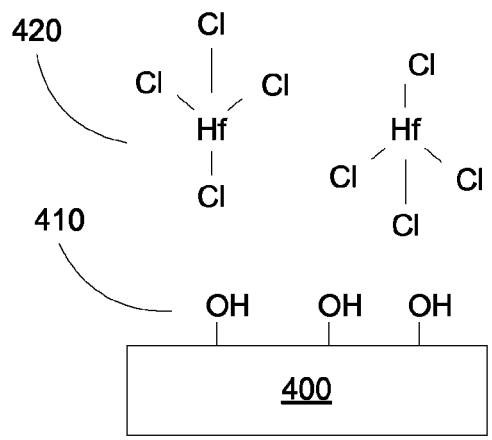
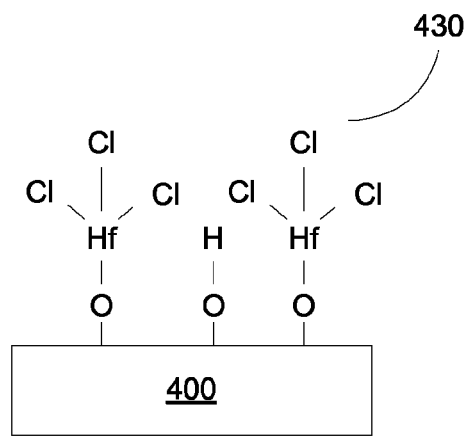
Fig. 4C    Fig. 4D
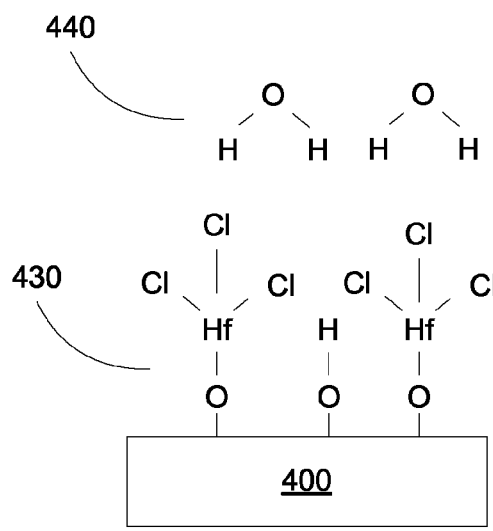
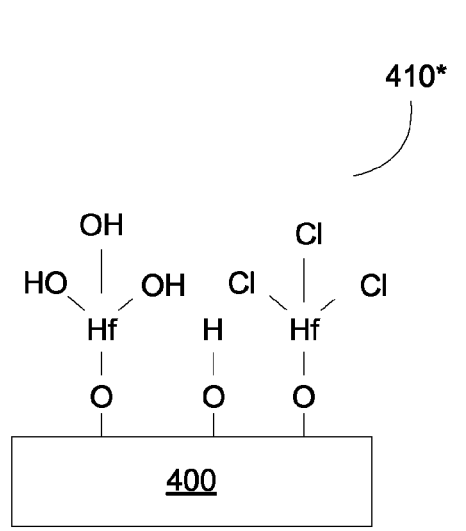
Fig. 4E    Fig. 4F

METHODS OF FORMING FLUORINATED HAFNIUM OXIDE GATE DIELECTRICS BY ATOMIC LAYER DEPOSITION

TECHNICAL FIELD

Provided are methods of forming semiconductor devices, and more particularly, to methods, and devices forming from the methods, for forming gate dielectrics.

BACKGROUND OF THE INVENTION

As integrated circuit feature sizes decrease, other device dimensions also decrease to maintain the proper device operation. For example, as gate conductor widths decrease, the thickness of the gate dielectric needs to decrease to provide proper capacitance to control the transistor.

To meet the requirements of sub-100 nm devices, an equivalent oxide thickness (EOT) of less than 1.5 nm is needed. Using $SiO_2$ as the gate dielectric, it is difficult to maintain its dielectric property below about 2 nm thickness due to the high tunneling leakage.

High-k materials, i.e., dielectric materials having higher dielectric constant k than that of $SiO_2$ (k~3.9), can provide high capacitance with higher thickness, and thus have been studied as replacement for $SiO_2$. For example, a high-k value of 20, which can be obtained with various transition metal oxides such as hafnium oxide, can be about five times thicker than a $SiO_2$ film with similar capacitance value. The thicker gate dielectric layer of high-k material can reduce tunneling leakage current through the gate, enabling sub-100 nm MOSFET devices.

The fabrication of high-k gate dielectric layers can provide difficulty in realizing the full benefits of the high dielectric constant. For example, processing high-k dielectric layers in the presence of oxygen at elevated temperatures, e.g., high-k deposition or subsequent anneal processes, can form a $SiO_2$ interfacial layer between the silicon substrate and the high-k layer. The $SiO_2$ interfacial layer can increase the effective oxide thickness, reducing the capacitance of the gate dielectric layer. Further, high-k gate dielectrics can contain a greater number of bulk traps and interface traps than thermally growth $SiO_2$ gate dielectrics. The traps can degrade the device performance, such as sub-threshold slope, threshold voltage, flatband voltage shift, and Frenkel-Poole tunneling leakage.

Thus there is a need to develop improved methods and structures involving high-k gate dielectrics and related semiconductor devices.

SUMMARY OF THE DESCRIPTION

In some embodiments, the present invention discloses methods to form a gate dielectric having fluorinated hafnium oxide material. The present fluorinated hafnium oxide can improve the gate dielectric reliability and minimizing device performance degradation. For example, fluorine can passivate interface traps by forming Si—F bonds at the interface of the dielectric layer with the silicon substrate. Fluorine can also passivate bulk traps by forming Hf—F bonds in the oxygen vacancy of the dielectric layer. The described fluorinated hafnium oxide layer can be used as a high k gate dielectric with improved device characteristics.

In some embodiments, the present invention discloses an ALD (atomic layer deposition) process for depositing a fluorinated hafnium oxide layer using an oxidant precursor together with a fluorinated hafnium precursor having hafnium and fluorine. The fluorinated hafnium precursor can include fluorinated hafnium beta-diketonates, such as tetrakis(hexafluoroacetylacetonate)hafnium ($Hf(Hhfac)_4$) and tetrakis(trifluoroacetylacetonate)hafnium ($Hf(Htfac)_4$). The oxidant precursor can include water, oxygen or ozone, which can react with the chemisorbed hafnium precursor to form an Hf—O surface. Some of the released fluoride-containing hydrocarbons (Hhfac or Htfac) can further react with Hf—O surface to form Hf—F bond, forming a fluorinated hafnium oxide layer.

In some embodiments, the present invention discloses a two-step deposition process including an interface layer deposition followed by a bulk layer deposition. In the interface layer deposition process, a fluorinated hafnium precursor together with an oxidant precursor can be used to deposit an interface layer of fluorinated hafnium oxide. Fluorinated hafnium oxide layer can have fewer interface traps, for example, due to Si—F bonds passivating the interface. In the bulk layer deposition process, a hafnium precursor together with the oxidant precursor can be used to deposit a bulk layer of hafnium oxide.

In some embodiments, the present invention discloses an ALD (atomic layer deposition) process including an interface layer deposition followed by a bulk layer deposition. In some embodiments, the present invention discloses an ALD process, including depositing a hafnium oxide layer by a first number of cycles using an oxidant and a fluorinated hafnium precursor, followed by a second number of cycles using the same or different oxidant and a hafnium precursor. Fluorinated hafnium oxide can have fewer defects, offering improved electrical properties, suitable for high k gate dielectrics in semiconductor device applications.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 4A-4F illustrate an exemplary process flow schematic of an ALD deposition of an exemplary hafnium oxide according to some embodiments.

DETAILED DESCRIPTION OF THE PREFERRED EMBODIMENTS

Figure 1:
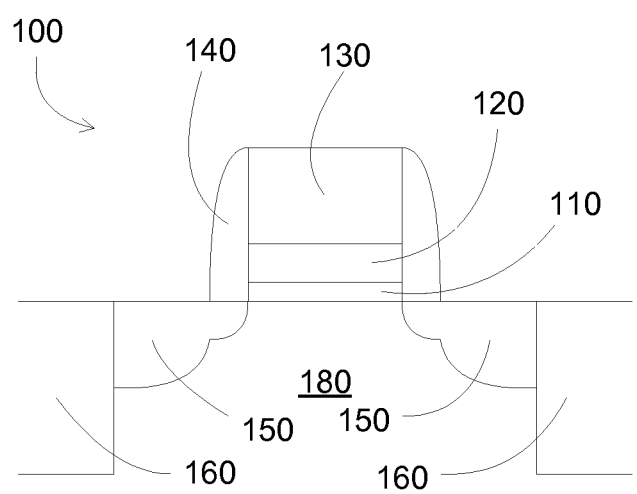
FIG. 1 illustrates an exemplary metal-oxide semiconductor field effect transistor (MOSFET) device according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, the present invention discloses methods, and structures fabricated from the methods, to form a gate dielectric, for example, hafnium oxide, hafnium silicon oxide ($HfSiO_x$), zirconium oxide, or other high k dielectrics. In the following description, hafnium oxide is used to as an illustrative example, but other high k dielectrics can be used, for example, derivatives of hafnium oxide such as hafnium silicon oxide ($HfSiO_x$) or hafnium aluminum oxide ($HfAlO_x$), or high k dielectrics having similar behaviors as compared to hafnium oxide such as zirconium oxide or zirconium oxide derivatives.

In some embodiments, the described gate dielectric can include a fluorinated hafnium oxide material with low defect density and with improved interface trap charge density. For example, fluorine elements in the fluorinated hafnium oxide can passivate the interface states by forming Si—F bonds at the interface of the gate dielectric with the silicon substrate. Further, fluorine elements in the fluorinated hafnium oxide can passivate the bulk $HfO_2$ traps by forming Hf—F bonds in the oxygen vacancy of the gate dielectric. The fluorination process of the gate dielectric can thus improve the gate dielectric reliability.

In some embodiments, the described gate dielectric can include a bulk hafnium oxide with low defect density positioned on an interfacial layer of fluorinated hafnium oxide with improved interface trap charge density. The bulk hafnium oxide layer can exhibit desirable gate dielectric properties, such as high dielectric constant, high density, large band gap, and good thermal stability. The interface fluorinated hafnium oxide can reduce the interface states and bulk traps of the hafnium oxide gate dielectric, potentially reducing threshold voltage shift and device degradation.

In some embodiments, the described gate dielectric can be formed by a two-step deposition process, which includes an interface layer deposition followed by a bulk layer deposition. In the interface layer deposition process, a fluorinated hafnium-containing precursor can be used to deposit a fluorinated oxide layer. In the bulk layer deposition process, a hafnium precursor can be used to deposit a hafnium oxide layer.

Advances in semiconductor processing have demanded ever-increasing functional density with continuous size scaling. This scaling process has led to the adoption high-k gate dielectrics and metal gate electrodes in metal gate stacks in semiconductor devices.

High-k gate dielectrics can offer a way to scale down the thickness of the gate dielectric with acceptable gate leakage current. The use of high-k gate dielectrics is often accompanied by a metal gate electrode, since thin gate dielectric layers may cause poly depletion, affecting the device operation and performance. Metal gate electrodes further have an advantage of higher electrical conductance, as compared to poly gates, and thus can improve signal propagation times.

The manufacture of high-k dielectric devices entails the integration and sequencing of many unit processing steps, with potential new process developments, since in general, high-k gate dielectrics are much more sensitive to process conditions than silicon dioxide. For example, interface traps and interface oxide formation can adversely affect the performance of the high-k gate structures.

Industry continues to search for new dielectric materials that exhibit high k value (i.e. dielectric constant) and low leakage, to enable further miniaturization of electronic devices. These materials may be used as the dielectric layer in electronic components such as capacitors, memory cell structures, and other devices. The k value is a measure of the polarization capability of dielectric materials in response to external electrical field, which can be used to store charges in capacitors. The ability of a dielectric material to store charge is also conveniently represented by the equivalent oxide thickness ("EOT"). A low EOT implies an increased ability to miniaturize semiconductor devices. The leakage is a measure of the capacitor's capability to retain stored charge for a certain period of time. Both EOT and leakage are important parameters for the miniaturization of electronic components such as capacitors, memory cell structure and other devices. Typical high-k materials include $Al_2O_3$ (k~9), HfSiO (k~5-20), $ZrO_2$ (k~25), $HfO_2$ (k~25), $Ta_2O_5$ (k~26), and $TiO_2$ (k~80).

In some embodiments, hafnium oxide gate dielectric layers can replace $SiO_2$ gate dielectric with thinner equivalent oxide thickness (EOT) required for lower transistor operating voltages and smaller transistor dimensions. Further, hafnium oxide layer can have a minimal $SiO_2$ interfacial layer. During the formation of hafnium oxide on a silicon layer, an interface layer of $SiO_2$ could be formed in addition to the hafnium oxide, resulting in two layers in series. The two-layer equivalent oxide thickness would be much higher than that of the hafnium oxide layer alone, and depending on the thickness of the $SiO_2$ interfacial layer, can be determined or limited by the $SiO_2$ interfacial layer thickness.

In some embodiments, the described invention discloses a deposition process to form a gate dielectric layer, including depositing a fluorinated hafnium oxide layer. In some embodiments, the described invention discloses a two step deposition process to form a gate dielectric layer, including depositing a fluorinated hafnium oxide layer before depositing a layer of hafnium oxide. The fluorinated hafnium oxide can provide a gate dielectric layer having hafnium oxide properties with minimal $SiO_2$ formation and a high quality interface to maintain high channel carrier mobility for the semiconductor device.

FIG. 1 illustrates an exemplary metal-oxide semiconductor field effect transistor (MOSFET) device according to some embodiments. The device 100 can be incorporated in integrated circuits, and can further include interconnects for connecting multiples devices. The device 100 is fabricated on a substrate 180, which is preferably single crystal silicon, although other substrates can be used, such as silicon-germanium substrates. A gate stack is fabricated on the substrate 180, including a high-k gate dielectric layer 110, a gate electrode layer 120 over the gate dielectric layer, and a gate conductor layer 130 over the gate electrode layer. The gate electrode layer can be a polysilicon gate layer or a metal gate layer. The device 100 is isolated from other devices by isolation regions 160, such as shallow trench isolation or local oxidation of silicon (LOCOS) isolation. The device 100 also comprises spacers 140 and source and drain regions 150. Source and drain regions 150 are doped, for example, with arsenic, phosphorous, boron or other suitable material, depending upon the desired transistor characteristics, using a self-aligning ion implantation process in substrate 180 or other suitable process. Other components can be included, such as n or p well region, depending on the type of the semiconductor devices.

Gate electrode layer 120 is deposited on high-k dielectric layer 110 and comprises aluminum, polysilicon, or other suitable conductive material (e.g., TiN, TaN, HfN, RuN, WN, W, MoN, TaSiN, RuSiN, WSiN, HfSiN, TiSiN, etc). Spacers 140 are deposited on the sides of gate electrode layer 120, high-k dielectric layer 110, and can comprise $SiO_2$, $Si_3N_4$, TEOS or other suitable dielectric material. Spacers 140 isolate gate electrode 120 and high-k dielectric layer 110 from source and drain 150.

High-k dielectric layer 110 includes a high-k dielectric material of $HfO_2$ or hafnium oxide derivatives. High-k dielectric layer 110 provides an equivalent oxide thickness (EOT) that allows increased performance and reduced transistor device size while not increasing tunneling leakage current through the gate. In some embodiments, the high k dielectric includes a layer of fluorinated hafnium oxide. In some embodiments, the high k dielectric includes a bi-layer of hafnium oxide on fluorinated hafnium oxide. Hafnium oxide can provide high dielectric constant, high density, large bandgap and good thermal stability. Fluorinated hafnium oxide can be a passivating interfacial and bulk layer, acting as an interface state or bulk traps reduction, for example, by forming Si—F bonds at the silicon interface or Hf—F bonds in the bulk hafnium oxide.

Figure 2A:
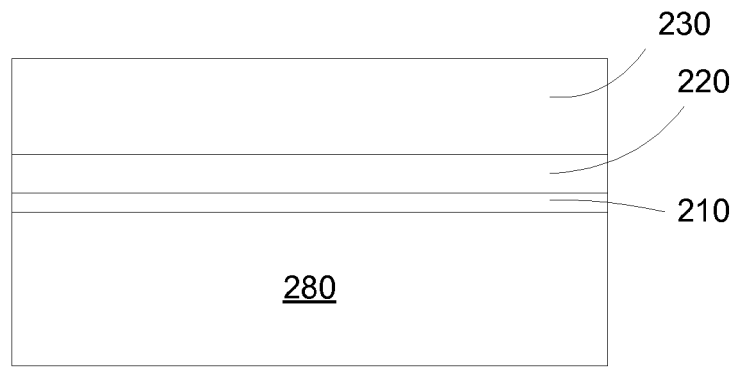
FIGS. 2A-2B illustrates a fabrication sequence for an exemplary metal gate electrode according to some embodiments.
Figure 2B:
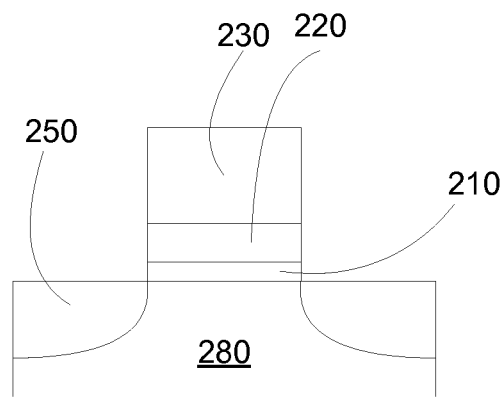

FIGS. 2A-2B illustrates a fabrication sequence for an exemplary metal gate electrode according to some embodiments. In FIG. 2A, blanket layers of gate dielectric 210, metal gate layer 220 and gate conductor layer 230 are deposited on a substrate 280. The substrate 280 can be previously processed, for example, to form device well and isolation regions. The structure shown is illustrative, and other configurations can be used, such as a single metal gate layer instead of a metal gate layer 220 and a gate conductor layer 230, and a gate dielectric layer stack comprising a high-k dielectric layer on a silicon dioxide pedestal layer instead of a single gate dielectric layer 210.

The gate dielectric layer 210 can be formed of a layer of fluorinated hafnium oxide deposited using fluorinated hafnium containing precursor; or of a bi-layer of hafnium oxide on fluorinated hafnium oxide, fabricated using two step deposition with fluorinated hafnium containing precursor and hafnium containing precursor. The fluorinated hafnium oxide or the bi-layer hafnium oxide/fluorinated hafnium oxide gate dielectric can improve the performance characteristics of semiconductor devices. In some embodiments, the thickness of the gate dielectric is less than 10 nm, for example, less than 3 nm. The thickness of the fluorinated hafnium oxide layer can be less than 2 nm, such as less than 1 nm. The thickness of the hafnium oxide layer can be less than 4 nm, such as less than 2 nm. The gate dielectric layer 210 can be formed by deposition, such as an ALD process.

Disposed on the gate dielectric layer 210 is a metal gate layer 220 together with a gate conductor layer 230. Alternatively, the gate conductor layer 230 can be omitted, leaving only a metal gate layer 220. The metal gate layer 220 typically includes a first metal, and the gate conductor 230 can either include a poly silicon or a second metal, different from the first metal. In some embodiments, the metal gate layer 220 is a metal-containing layer, having a metal component together with other combination of materials.

The metal gate layer 220 can include a refractory metal or a nitride of a refractory metal, such as titanium nitride. Alternatively, the metal gate layer 220 can include other metals, including WN, TaN, Mo, $RuO_2$, or NiSi. The thickness of the metal gate layer 220 can be less than 20 nm with the gate conductor layer, or can be less than 200 nm without a gate conductor layer.

The gate conductor layer 230 can include silicon, such as doped poly silicon. Alternatively, the gate conductor layer 230 can include a second metal, different from the first metal in the metal gate layer 220. In addition, the gate conductor can be omitted. The thickness of the gate conductor can be less than 200 nm.

The metal gate layer 220 and gate conductor layer 230 can be formed by any methods, such as atomic layer deposition (ALD), physical vapor deposition (PVD), chemical vapor deposition (CVD), and spin coating.

FIG. 2B show a device having the gate conductor layer 230, the metal gate 220, and the gate dielectric 210. Any patterning process can be used, for example, lithography patterning process using photoresist mask and dry or wet etching. The layers can be patterned using a plasma etch process or a wet etch process.

After the completion of the metal gate electrode, the substrate can be further processed to form active devices and circuits. For example, additional steps of implanting dopants to form source and drain structures 250, forming gate spacers, and shallow junctions. Interconnect metal lines can be included, connecting a plurality of active devices to form an integrated circuit. There can be silicide regions (not shown) on the gate conductor layer 230 for improving contact resistance. The device shown is an exemplary planar device configuration, and other device configurations are also within the scope of the present invention, such as tri-gate transistor configurations, fin-FET configurations, or different types of transistors or devices.

In some embodiments, the present invention discloses an ALD (atomic layer deposition) process for depositing a gate dielectric layer including a fluorinated hafnium oxide. The method can include a bulk layer deposition, or an interface layer deposition followed by a bulk layer deposition. In some embodiments, the described ALD process includes depositing a fluorinated hafnium oxide layer as a gate dielectric. In some embodiments, the described ALD process includes depositing a fluorinated hafnium oxide layer by a first number of cycles using a precursor having fluorine and hafnium components (such as fluorinated hafnium beta-diketonate precursors), followed by depositing a hafnium oxide layer by a second number of cycles using a precursor having hafnium component (such as hafnium amino type precursors). Fewer interface states and bulk traps can provide a gate dielectric layer with improved electrical properties, suitable for high k gate dielectrics in semiconductor device applications.

ALD as used herein refers to the sequential introduction of two or more reactive compounds to deposit a layer of material on a substrate surface. The two, three or more reactive compounds may alternatively be introduced into a reaction zone of a deposition chamber. Usually, each reactive compound is separated by a time delay to allow each compound to adhere and/or react on the substrate surface. In some embodiments, a first precursor or compound A is pulsed into the reaction zone of a deposition chamber (e.g., ALD chamber) followed by a first time delay. Next, a second precursor or compound B is pulsed into the reaction zone followed by a second delay. During each time delay a purge gas, such as argon or nitrogen, may be pulsed or otherwise provided into the deposition chamber to purge the reaction zone or otherwise remove any residual reactive compound or by-products from the reaction zone or other surfaces. Alternatively, the purge gas may flow continuously throughout the deposition process so that only the purge gas flows during the time delay between pulses of reactive compounds. The reactive compounds are alternatively pulsed until a desired film or film thickness is formed on the substrate or deposition. In either scenario of a continuous or intermittent purge gas flow, the ALD process of pulsing compound A, purge gas, pulsing compound B, and purge gas is an ALD cycle. An ALD cycle can start with either compound A or compound B and continue the respective order of the ALD cycle until achieving a film with the desired thickness. In some embodiments, a first precursor or compound A is pulsed into the reaction zone of a deposition chamber (e.g., ALD chamber) followed by a first time delay. Next, a second precursor or compound B is pulsed into the reaction zone followed by a second delay. Next, a third precursor or compound C is pulsed into the reaction zone followed by a third delay. During each time delay a purge gas, such as argon or nitrogen, may be pulsed or otherwise provided into the deposition chamber to purge the reaction zone or otherwise remove any residual reactive compound or by-products from the reaction zone or other surfaces. Alternatively, the purge gas may flow continuously throughout the deposition process so that only the purge gas flows during the time delay between pulses of reactive compounds. The reactive compounds are alternatively pulsed until a desired film or film thickness is formed on the substrate or deposition surface. In either scenario of a continuous or intermittent purge gas flow, the ALD process of pulsing compound A, purge gas, pulsing compound B, purge gas, pulsing compound C, and purge gas is an ALD cycle. Alternatively, the ALD process of pulsing compound A, purge gas, pulsing compound B, purge gas, pulsing compound C, purge gas, pulsing compound B, and purge gas is an ALD cycle. An ALD cycle can start with either compound A, compound B, or compound C and continue the respective order of the ALD cycle until achieving a film with the desired thickness.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the deposition chamber employed, the vacuum system coupled thereto, and the volatility/reactivity of the particular compound itself. A "half-reaction" as used herein is intended to refer to a pulse of precursor step followed by a purge step.

Figure 3:
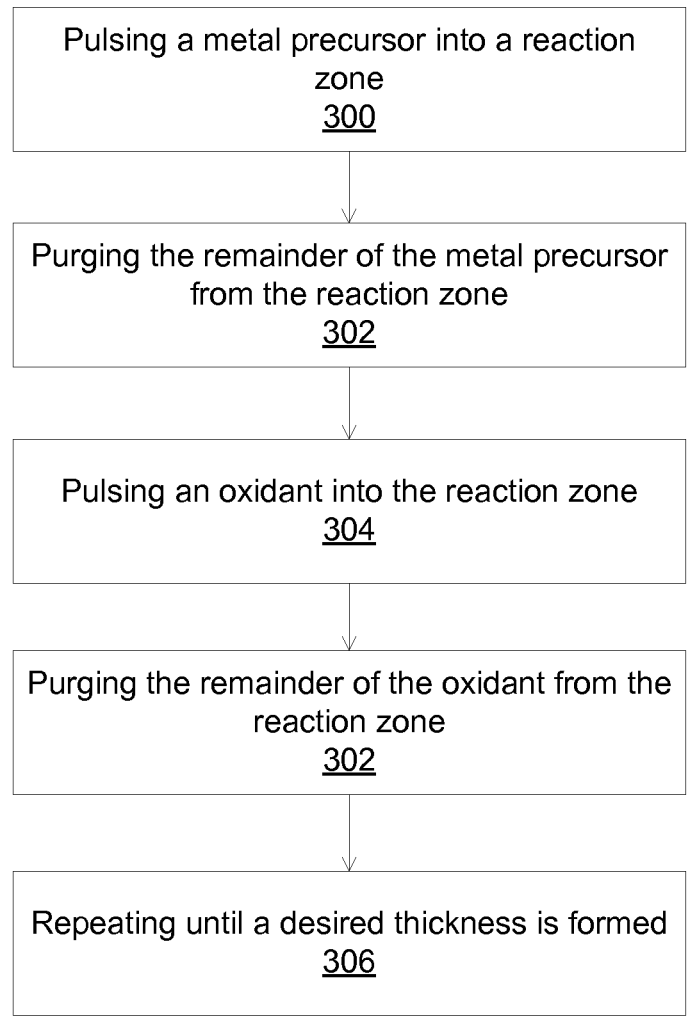
FIG. 3 illustrates a flow chart of an ALD deposition of metal oxide dielectric materials according to some embodiments.

FIG. 3 illustrates a flow chart of an ALD deposition of metal oxide dielectric materials according to some embodiments. In step 300, a metal precursor is pulsed into the reaction zone. A portion of the precursor adsorbs onto the surface at reactive sites. In step 302, the remainder of the precursor is purged from the reaction zone. In step 304, an oxidant is then pulsed into the reaction zone to react with the adsorbed precursor and form a metal oxide dielectric material. In step 305, the remainder of the oxidant is purged from the reaction zone. In step 306, this sequence is repeated until the desired thickness of the metal oxide dielectric material is formed.

In some embodiments, the present invention discloses forming a fluorinated hafnium oxide gate dielectric, or a bi-layer of hafnium oxide/fluorinated hafnium oxide gate dielectric using atomic layer deposition (ALD). Some of the materials and/or layers of the fluorinated hafnium oxide and hafnium oxide layer may be deposited or otherwise formed using a variety of deposition techniques, but in many embodiments described herein, all of the materials and/or layers of fluorinated hafnium oxide and hafnium oxide layers may be deposited using thermal ALD processes and/or plasma-enhanced ALD (PE-ALD). In some embodiments, a fluorinated hafnium oxide gate dielectric layer can be formed by utilizing a fluorinated hafnium precursor and an oxygen-containing oxidant, such as water, ozone, atomic oxygen, or oxygen plasma. In some embodiments, an interfacial fluorinated hafnium oxide layer can be formed by utilizing a fluorinated hafnium precursor and an oxygen-containing oxidant, such as water, ozone, atomic oxygen, or oxygen plasma, together with a bulk hafnium oxide layer formed by utilizing a hafnium precursor and an oxygen based oxidant.

The ALD processes for depositing or otherwise forming gate dielectric materials are typically conducted in a deposition chamber, such as an ALD chamber. The deposition chamber may maintain an internal pressure of less than 760 Torr, such as within the range from about 10 mTorr to about 10 Torr, such as from about 100 mTorr to about 1 Torr, for example, about 350 mTorr. The temperature of the device, the substrate, or the substrate carrier/pedestal is usually maintained within the range from about 50° C. to about 1,000° C., such as from about 100° C. to about 500° C., such as from about 200° C. to about 400° C., or such as from about 250° C. to about 300° C.

The metal oxide precursor, e.g., fluorinated hafnium and/or hafnium precursor, can be pulsed, introduced, or otherwise provided into the deposition chamber at a flow rate within the range from about 0.1 sccm to about 200 sccm, such as from about 0.5 sccm to about 50 sccm, from about 1 sccm to about 30 sccm, for example, about 10 sccm. The metal oxide precursor can be provided along with a carrier gas, such as argon or nitrogen. The carrier gas may have a flow rate within the range from about 1 sccm to about 300 sccm, such as from about 2 sccm to about 80 sccm, from about 5 sccm to about 40 sccm, for example, about 20 sccm.

The metal oxide precursor may be pulsed or otherwise provided into the deposition chamber at a rate within a range from about 0.01 seconds to about 60 seconds, depending on the particular process conditions, precursors or desired composition of the deposited oxide materials.

In some embodiments, the fluorinated hafnium precursor is an organic precursor having an organic ligand. For example, the fluorinated hafnium precursor can include fluorinated hafnium beta-diketonates, such as tetrakis(hexafluoroacetylacetonate)hafnium (Hf(Hhfac)$_4$) and tetrakis(trifluoroacetylacetonate)hafnium (Hf(Htfac)$_4$).

In some embodiments, the hafnium precursor is a hafnium inorganic precursor, such as hafnium chloride (HfCl$_4$), hafnium iodine (HfI$_4$), or anhydrous hafnium nitrate (Hf(NO$_3$)$_4$). In some embodiments, the hafnium precursor is a hafnium organic precursor comprising an organic ligand. For example, the metal source can be a hafnium precursor which is a tetrakis(dialkylamino)hafnium compound, such as tetrakis(dimethylamino)hafnium ((Me$_2$N)$_4$Hf or TDMAH), tetrakis(diethylamino)hafnium ((Et$_2$N)$_4$Hf or TDEAH), or tetrakis(ethylmethylamino)hafnium ((EtMeN)$_4$Hf or TEMAH).

The metal oxide precursor can be dispensed into a deposition chamber by introducing a carrier gas through an ampoule containing the organic precursor. An ampoule unit can include an ampoule, a bubbler, a canister, a cartridge, or other container used for storing, containing, or dispersing chemical precursors. For example, the ampoule can contain a liquid precursor (e.g., TDMAH or TDEAH) and be part of a liquid delivery system containing injector valve system used to vaporize the liquid precursor with a heated carrier gas. Generally, the ampoule can be heated to a temperature of about 180° C. or less, such as within a range from about 30° C. to about 180° C., for example, about 50° C. Alternatively, the precursor can be in gaseous form, and can be delivered directly to the deposition. The precursor can be in solid form, such as $HfCl_4$, and can be vaporized from solid to vapor, for example, upon heating to above 150 C to achieve relatively high vapor pressure.

The oxidizing agent (e.g., $O_2$, $O_3$, $H_2O$) may be pulsed, introduced, or otherwise provided into the deposition chamber at a flow rate within a range from about 0.01 seconds to about 60 seconds, depending on the particular process conditions, oxygen source gas or oxidizing agent or desired composition of the deposited metal oxide material. In some embodiments, such as for forming a metal-poor oxide material, the oxidizing agent may be pulsed, introduced, or otherwise provided into the deposition chamber at a rate within a range from about 0.001 seconds to about 1 second, such as from about 0.001 seconds to about 0.1 seconds, for example, about 0.05 seconds. The oxidizer may be delivered to the process chamber by known methods. For example, a water vapor generator is used to generate water vapor and deliver (or pulse) it to the process chamber as the oxidizer. Ozone may be formed inside or outside of the deposition chamber, such as the ALD chamber. In some embodiments, the oxidizing agent contains ozone formed by an ozone generator positioned outside of the deposition chamber. Ozone is generated and then flowed or directed into the deposition chamber and exposed along with the metal source gas to the substrate surface. In some embodiments, the oxidizing agent contains ozone formed by a plasma generated within the interior of the deposition chamber. Oxygen gas flowed or directed into the deposition chamber, then ignited or formed into ozone and/or atomic oxygen before being sequentially exposed along with the precursor to the substrate surface.

The chamber may be purged between oxidizing and precursor exposure, and between repeating cycles of exposure to the oxidizer and precursor, and the cycles may be repeated a desired number of times. The purging process may use an inert gas or inactive gas, for example, such as nitrogen, argon, helium, mixtures thereof, or combinations thereof. The purge time may be any desired time for removing excess reactant from the chamber.

A carrier gas or a purge gas can be provided at the same time as the metal oxide precursor and/or the oxidant precursor, but can be also provided between the pulses of the metal oxide precursor (e.g. fluorinated hafnium or hafnium) and/or the oxidant precursor. The carrier gas or purge gas can flow continuously during the ALD process or can be intermediately and/or sequentially pulsed, introduced, or otherwise provided during the ALD process. The carrier gas or purge gas may be pulsed, introduced, or otherwise provided into the deposition chamber at a rate within a range from about 1 second to about 60 seconds, depending on the particular process conditions, source gases, or desired composition of the deposited metal oxide material. In some embodiments, the carrier gas or a purge gas may be pulsed, introduced, or otherwise provided into the deposition chamber at a rate within a range from about 1 second to about 30 seconds, such as from about 2 seconds to about 20 seconds, for example, about 10 seconds or about 15 seconds. Other purging times can be used.

The carrier gas or the purge gas may be sequentially pulsed, introduced, or otherwise provided after each pulse of the metal precursor and each pulse of the oxidizing agent during the ALD cycle. The pulses of purge gas or carrier gas are typically pulsed, introduced, or otherwise provided at a flow rate within a range from about 2 standard liters per minute (slm) to about 22 slm, such as about 10 slm. Other purging flows can be used.

Once the desired number of cycles of alternating exposure to the oxidizer and precursor are carried out, a post-deposition anneal may be performed to densify the film stack. The post-deposition anneal may be a high temperature bake, a post-oxidation anneal, or a high temperature anneal in the presence of a non-oxidizing gas, such as $N_2$. In some embodiments, the substrate temperature during the post-deposition anneal is in the range of about 500-1000° C., such as about 550-800° C. Exemplary post-deposition anneals include exposure to NO at about 600° C. or exposure to $N_2$ at about 800° C. The anneal may be performed for any desired amount of time. By way of example and not limitation, the anneal may be performed for about 30 seconds up to 30 minutes, or about 5-20 minutes, for example about 10 minutes. In some embodiments, a low temperature post-deposition anneal may be carried out, for example at a temperature below about 500° C., such as about 250-450° C. In some embodiments, a flow rate of up to about 20 slm, for example about 0.1-5 slm, may be used for the oxidation gas or non-oxidizing gas.

FIGS. 4A-4F illustrate an illustrative process flow schematic of an ALD deposition of an exemplary hafnium oxide according to some embodiments. In FIG. 4A, a substrate 400 is provided in a process chamber. The substrate can be a semiconductor substrate such as a silicon substrate. In some embodiments, the substrate 400 is already processed to form appropriate structures for semiconductor devices. For example, n well and p well regions can be formed for forming a foundation for p-type and n-type transistors. In FIG. 4B, the substrate surface is conditioned for ALD deposition, for example, by providing an OH terminated surface 410. The OH surface 410 can be prepared by exposing the substrate to water.

In FIG. 4C, hafnium chloride ($HfCl_4$) precursor 420 is introduced to the process chamber. In FIG. 4D, hafnium chloride precursor reacts with the OH surface to form hafnium oxide bonding 430. The un-reacted hafnium chloride precursor is purged from the chamber. In FIG. 4E, water 440 is introduced to the process chamber. In FIG. 4F, water molecules react with hafnium surface 430 to conditioning the substrate surface to OH terminated surface 410*. The process cycle continues, for example, by introducing hafnium chloride precursor to react with OH terminated surface.

The above description shows an example of ALD hafnium oxide deposition using $HfCl_4$ precursor and $H_2O$ oxidant. The behaviors of other precursors and oxidants are similar, such as $HfCl_4$ with ozone, or a fluorinated hafnium precursor with water or ozone oxidant.

In some embodiments, the present invention discloses forming a fluorinated hafnium oxide layer or an interface fluorinated hafnium oxide layer on a silicon substrate. The fluorinated hafnium oxide can be formed by reacting a fluorinated hafnium precursor, such as fluorinated hafnium beta-diketonates, with water (or other oxygen containing chemicals, such as ozone). Fluorinated hafnium oxide can passivate the interface states or bulk traps due to hafnium oxide, for example, by forming Si—F or Hf—F bonds. For example, during a number of ALD cycles of an ALD fluorinated hafnium oxide deposition, an oxidant step, e.g., using water, ozone, atomic oxygen or plasma excited oxygen, can be provided to engineer the fluorinated hafnium oxide interfacing the silicon substrate.

In some embodiments, a hafnium oxide layer then can be formed on the fluorinated hafnium oxide layer, for example, by reacting a hafnium precursor with an oxidant, which can be the same or different oxidant used in the formation of the fluorinated hafnium oxide layer). For example, for ALD reaction using $HfCl_4$ precursor and $O_3$ oxidant, the flow rate and concentration of ozone can be optimized to achieve hafnium oxide layer with good electrical performance. For example, low concentration and low flow of ozone can be used, followed by high concentration and high flow to obtain less ozone diffusion to the interface with high oxygen concentration in the bulk hafnium oxide layer.

In some embodiments, the present invention discloses a method to form a gate dielectric for a semiconductor device. The method includes providing a silicon-containing substrate; depositing a layer of fluorinated hafnium oxide on the substrate using an ALD process comprising alternating a fluorinated hafnium-containing precursor and an oxygen-containing precursor. The ALD process can have between 5 to 40 ALD cycles, or for depositing a layer having less than 10 monolayer thickness or less than 3 nm thickness.

In some embodiments, the present invention discloses a method to form a bi-layer gate dielectric for a semiconductor device. The method includes providing a silicon-containing substrate; depositing a first layer of fluorinated hafnium oxide on the substrate using an ALD process comprising alternating a fluorinated hafnium-containing precursor and an oxygen-containing precursor; and depositing a second layer of hafnium oxide on the first layer using an ALD process comprising alternating the hafnium-containing precursor and an oxygen-containing precursor or a plasma oxygen precursor. The ALD process for depositing the first layer can have between 5 to 20 ALD cycles, or for less than 3 monolayer thickness, or for less than 1 nm thickness. The ALD process can have between 5 to 40 ALD cycles, or for depositing a second layer having less than 10 monolayer thickness or for less than 2 nm thickness.

In some embodiments, the present invention discloses an ALD process to form a gate dielectric, including depositing a first number of cycles with a fluorinated hafnium precursor and a first oxidant, followed by a second number of cycles with a hafnium precursor and a second oxidant, which can be the same or different from the first oxidant.

In some embodiments, the present invention discloses methods to form a semiconductor device, including forming a fluorinated hafnium oxide gate dielectric or a bi-layer of fluorinated hafnium oxide/hafnium oxide gate dielectric on a semiconductor substrate, followed by forming a transistor structure on the gate dielectric. The gate dielectric can be formed by a two step ALD deposition process, including a first step of using a fluorinated hafnium precursor and a second step of using a hafnium precursor.

Figure 5A:
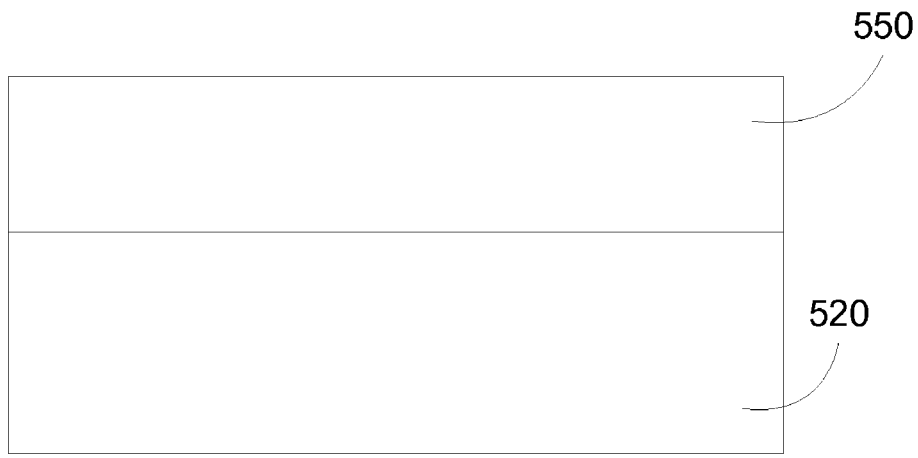
FIGS. 5A-5B illustrates an exemplary gate dielectric according to some embodiments.
Figure 5B:

FIGS. 5A-5B illustrates gate dielectrics according to some embodiments. In FIG. 5A, a fluorinated hafnium oxide layer 550 is disposed on a silicon substrate 520. The fluorinated hafnium oxide layer 550 can be deposited by an ALD process, utilizing a fluorinated hafnium precursor and an oxygen based oxidant. In FIG. 5B, a hafnium oxide layer 540 is disposed on a fluorinated hafnium oxide layer 530, which is disposed on a silicon substrate 520. The hafnium oxide layer 540 can be deposited by an ALD process, utilizing a hafnium precursor and an oxygen based oxidant. The fluorinated hafnium oxide layer 530 can also be deposited by an ALD process, utilizing a fluorinated hafnium precursor and an oxygen based oxidant. In some embodiments, the two oxide layers are distinct, deposited in sequence. In some embodiments, the two oxide layers are deposited in situ, with the hafnium oxide layer immediately following the fluorinated hafnium oxide layer, for example, by switching the precursor from fluorinated hafnium precursor to hafnium precursor.

Figure 6A:
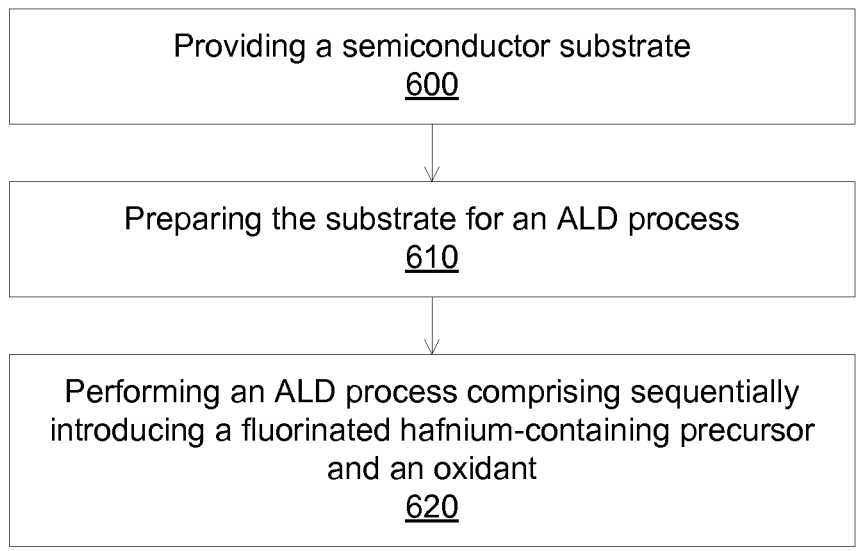
FIGS. 6A-6B illustrates an exemplary flowchart for forming a gate dielectric layer according to some embodiments.
Figure 6B:
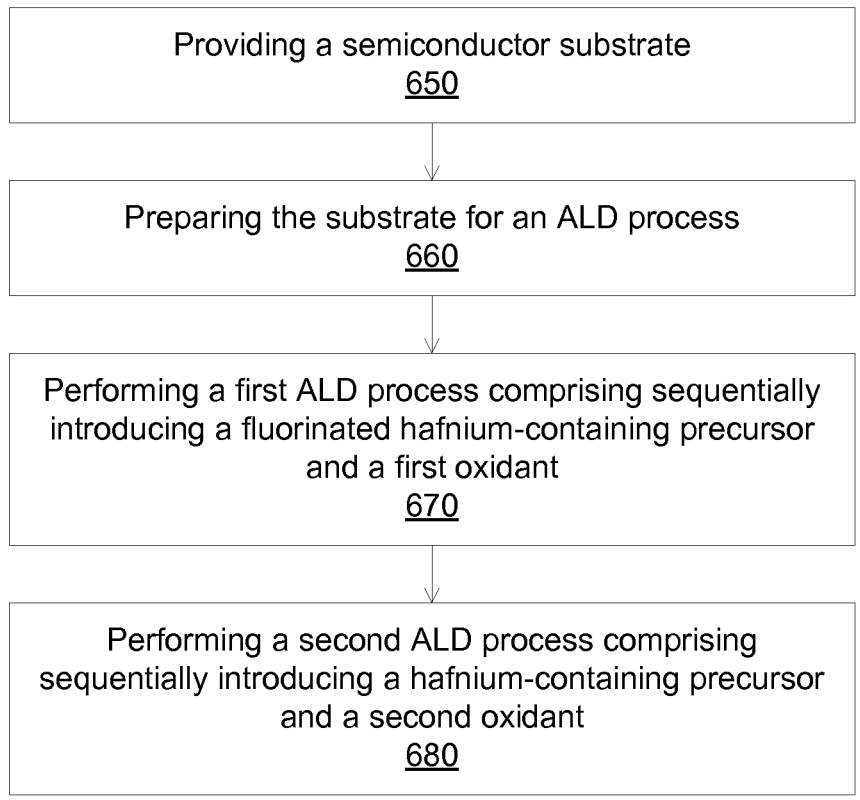

FIGS. 6A-6B illustrate flowcharts for forming a gate dielectric layer according to some embodiments. In FIG. 6A, a fluorinated hafnium oxide layer is deposited by an ALD process to form a gate dielectric. In operation 600, a semiconductor substrate is provided. The substrate can be a silicon substrate that can include one or more processing steps performed thereon. In operation 610, the substrate is prepared for ALD process, including being heated, for example by heating a pedestal on which the substrate is mounted in an ALD chamber. In this way, a pedestal temperature is maintained for an ALD deposition process so that the hafnium oxide layers can be deposited. After preparing the substrate, a fluorinated oxide layer is formed using ALD process. In operation 620, an ALD process is performed, for example, by sequentially introducing and purging a fluorinated hafnium oxide layer and an oxidant.

As mentioned above, ALD is a multi-step process used to deposit semiconductor layers. An ALD-deposited layer typically includes multiple cycles to deposit a layer of a desired thickness, so the process is repeated until the desired layer thickness has been deposited.

In a typical ALD metal oxide formation, a first reagent is introduced to (e.g. flowed onto) a substrate by introducing the first reagent into an ALD chamber. The first reagent can be a fluorinated hafnium-containing precursor that is used to form a fluorinated hafnium oxide. For example, the first reagent can be a fluorinated hafnium precursor such as $Hf(Hhfac)_4$ or $Hf(Htfac)_4$.

The excess (unreacted portion) of the first reagent is purged, for example by purging the ALD chamber to remove excess precursor. The purge duration can be less than or equal to about 60 seconds.

A second reagent is introduced to the substrate. The second reagent combines with the first reagent to form the fluorinated hafnium oxide. The second reagent is an oxidizer, for example water vapor, alcohol vapor, oxygen, ozone, or plasma oxygen. The second reagent forms an oxide of the metal contained in the first reagent (the precursor). The unreacted second reagent is then purged.

It is determined whether another ALD deposition cycle is to be performed. A typical ALD cycle may form a layer that is 0.05 nm, for example. To form a 1 nm hafnium oxide layer, 20 cycles would need to be performed. So, if it is determined that the desired number of cycles has been performed or that the desired thickness has been reached, the process continues. If more ALD cycles need to be completed, the sequence is repeated.

In FIG. 6B, a bi-layer of hafnium oxide/fluorinated hafnium oxide is deposited using ALD processes to form a gate dielectric. In operation 650, a semiconductor substrate is provided. The substrate can be a silicon substrate that can include one or more processing steps performed thereon. In operation 660, the substrate is prepared for ALD process. After preparing the substrate, a fluorinated hafnium oxide layer is formed using ALD process. In operation 670, a first few cycles of the ALD process, for example, between 5 to 20 cycles, is used to form a fluorinated hafnium oxide layer using a fluorinated hafnium precursor together with an oxidant. The fluorinated hafnium precursor can be a fluorinated hafnium beta-diketonates such as $Hf(Hhfac)_4$ or $Hf(Htfac)_4$. The oxidant can be an oxygen-containing gas or vapor, such as water vapor, alcohol vapor, oxygen, ozone, or plasma oxygen.

The number of ALD cycles can be determined from a desired thickness of the fluorinated hafnium oxide. A typical ALD cycle may form a layer that is 0.05 nm, for example. To form a 0.5 nm hafnium oxide layer, 10 cycles would need to be performed.

In operation 680, a hafnium oxide layer is formed using ALD process with the hafnium precursor together with an oxygen-containing oxidant, such as water vapor, alcohol vapor, oxygen, ozone, or plasma oxygen. The excess (unreacted portion) of the first reagent is purged, for example by purging the ALD chamber to remove excess precursor. A second reagent is introduced to the substrate. The second reagent combines with the first reagent to form the hafnium oxide. The second reagent is an oxygen-containing oxidizer, for example water vapor, alcohol vapor, oxygen, ozone, or plasma oxygen. In some embodiments, the same oxidant of the ALD hafnium oxide process is used. The second reagent forms an oxide of the hafnium metal contained in the first reagent (the precursor). The unreacted second reagent is then purged.

It is determined whether another ALD deposition cycle is to be performed. A typical ALD cycle may form a layer that is 0.5 Å, for example. To form a 2 nm hafnium oxide layer, 40 cycles would need to be performed. So, if it is determined that the desired number of cycles has been performed or that the desired thickness has been reached, the ALD sequence stops. If more ALD cycles need to be completed, the sequence is repeated.

Figure 7:
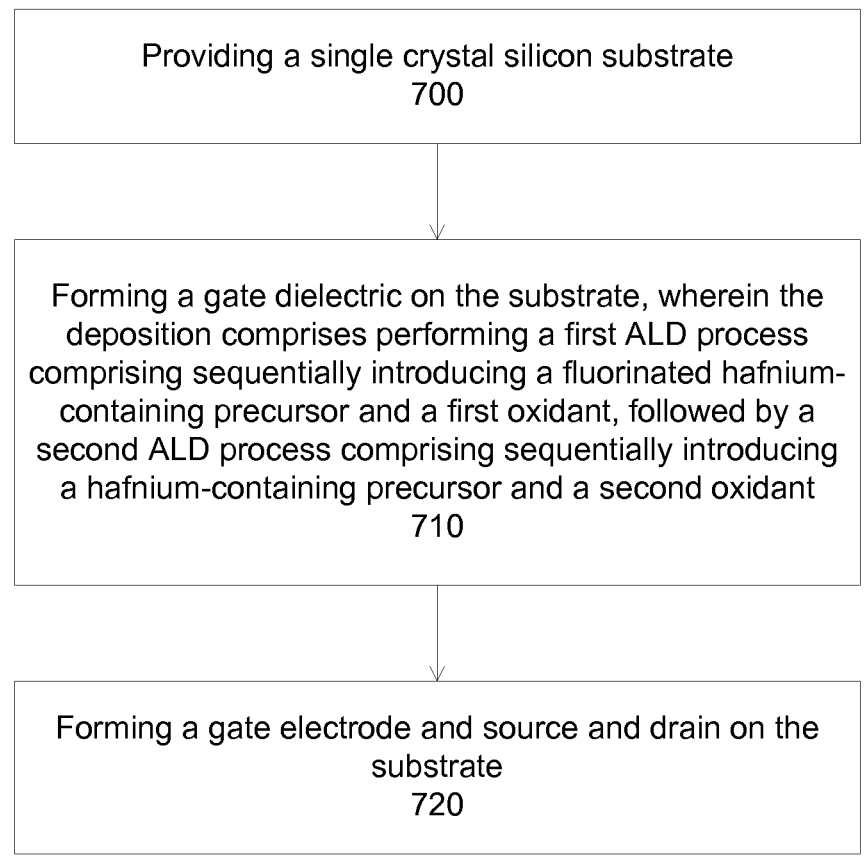
FIG. 7 illustrates an exemplary flowchart for forming a semiconductor device according to some embodiments.

FIG. 7 illustrates an illustrative flowchart for forming a semiconductor device according to some embodiments. The described flowchart is a general description of techniques used to form the semiconductor device described above. The flowchart describes techniques for forming a semiconductor device generally including a gate stack disposed on a semiconductor channel between a source and a drain. Although certain processing techniques and specifications are described, it is understood that various other techniques and modifications of the techniques described herein may also be used.

In operation 700, a substrate is provided. In operation 710, a gate dielectric is formed on the substrate. The substrate is first prepared for ALD process, for example, heated to a temperature less than or equal to about 45° C. After preparing the substrate, a gate dielectric having a fluorinated oxide is formed. In some embodiments, a fluorinated hafnium oxide layer is formed using an ALD process. In some embodiments, a fluorinated oxide layer is formed using a first ALD process, followed by a hafnium oxide layer, formed by a second ALD process. For example, a first few cycles of the first ALD process, e.g., less than 20 cycles, is used to form the fluorinated hafnium oxide layer, utilizing a fluorinated hafnium precursor together with an oxidant. The second few cycles of the ALD process is used to form the hafnium oxide layer, utilizing a hafnium precursor together with an oxidant. The ALD process can be a standard ALD process as discussed above, including sequentially introducing and purging the precursor and the oxidant to form the fluorinated hafnium oxide and hafnium oxide layers.

In operation 720, other processes are performed to complete the semiconductor device, including depositing a gate electrode, a gate conductor, patterning the gate dielectric and the gate electrode and conductor, forming source and drain regions, and forming spacer. Device interconnection can also be included.

The above description describes in some detail a gate dielectric having a fluorinated hafnium oxide material, such as a fluorinated hafnium oxide layer for gate dielectric, or a bi-layer of hafnium oxide/fluorinated hafnium oxide for gate dielectric. However, the invention is not so limited, and other high-k materials can be used. For example, derivatives of hafnium oxide, such as hafnium silicon oxide or hafnium aluminum oxide can be used in place of hafnium oxide, forming fluorinated hafnium silicon oxide or fluorinated hafnium aluminum oxide, either as a single layer gate dielectric or an interface layer in a bi-layer gate dielectric. In addition, high k materials having similar characteristics as hafnium oxide can also be used, such as zirconium oxide or derivatives of zirconium oxide.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for forming a dielectric layer, comprising
forming a layer on a substrate,
wherein the layer comprises a fluorinated hafnium oxide material,
wherein the layer is deposited by an ALD process,
wherein the ALD process comprises applying a fluorinated hafnium precursor followed by applying an oxidant under conditions to deposit a fluorinated hafnium oxide layer, and
wherein the fluorinated hafnium precursor comprises a fluorinated hafnium beta-diketonate.

2. A method as in claim 1 wherein the fluorinated hafnium precursor comprises one of tetrakis(hexafluoroacetylacetonate)hafnium ($Hf(Hhfac)_4$) or tetrakis(trifluoroacetylacetonate)hafnium ($Hf(Htfac)_4$).

3. A method as in claim 1 wherein the oxidant comprises an oxygen-containing fluid.

4. A method as in claim 1 wherein the oxidant comprises one of water vapor, alcohol vapor, oxygen, ozone, or plasma oxygen.

5. A method as in claim 1 wherein the thickness of the layer is less than 3 nm.

6. A method as in claim 1 wherein the dielectric layer is operable as a gate dielectric of a semiconductor device, the method further comprising
forming a gate electrode layer disposed on the dielectric layer;
forming source and drain regions on the substrate.

7. A method for forming a dielectric layer, comprising
forming a first layer on a substrate, wherein the first layer comprises a fluorinated hafnium oxide material,
wherein the first layer is deposited by a first ALD process,
wherein the first ALD process comprises applying a fluorinated hafnium precursor followed by applying a first oxidant under conditions to deposit a fluorinated hafnium oxide layer; and
forming a second layer on the first layer,
wherein the second layer comprises a hafnium oxide material,
wherein the second layer is deposited by a second ALD process,
wherein the second ALD process comprises applying a hafnium precursor followed by applying a second oxidant under conditions to deposit a hafnium oxide layer.

8. A method as in claim 7 wherein the first ALD process for depositing the first layer comprises between 5 to 10 ALD cycles.

9. A method as in claim 7 wherein the thickness of the first layer is less than 1 nm.

10. A method as in claim 7 wherein the second ALD process for depositing the second layer comprises between 5 to 20 ALD cycles.

11. A method as in claim 7 wherein the thickness of the second layer is less than 2 nm.

12. A method as in claim 7 wherein the first and second layers are formed in situ in a same process chamber.

13. A method as in claim 7 wherein the fluorinated hafnium precursor comprises one of tetrakis(hexafluoroacetylacetonate)hafnium (Hf(Hhfac)$_4$) or tetrakis(trifluoroacetylacetonate)hafnium (Hf(Htfac)$_4$).

14. A method as in claim 7 wherein the hafnium precursor comprises one of hafnium chloride (HfCl$_4$), hafnium iodine (HfI$_4$), anhydrous hafnium nitrate (Hf(NO$_3$)$_4$), tetrakis(dimethylamino)hafnium ((Me$_2$N)$_4$Hf or TDMAH), tetrakis(diethylamino)hafnium ((Et$_2$N)$_4$Hf or TDEAH), or tetrakis(ethylmethylamino)hafnium ((EtMeN)$_4$Hf or TEMAH).

15. A method as in claim 7 wherein the oxidant comprises one of water vapor, alcohol vapor, oxygen, ozone, or plasma oxygen.

16. A method as in claim 7 wherein the dielectric layer is operable as a gate dielectric of a semiconductor device, the method further comprising forming a gate electrode layer disposed on the dielectric layer;

forming source and drain regions on the substrate.

* * * * *